United States Patent

Broster

[11] 4,223,299
[45] Sep. 16, 1980

[54] INPUT CIRCUITS

[75] Inventor: David L. Broster, Amersham, England

[73] Assignee: The English Electric Company Limited, London, England

[21] Appl. No.: 932,127

[22] Filed: Aug. 9, 1978

[30] Foreign Application Priority Data

Aug. 12, 1977 [GB] United Kingdom ............... 33931/77

[51] Int. Cl.² ............................................. H04Q 3/00
[52] U.S. Cl. ........................... 340/166 R; 340/171 PF
[58] Field of Search ......... 340/171 PF, 365 S, 166 R; 358/194; 179/90 K

[56] References Cited

U.S. PATENT DOCUMENTS

| | | | |
|---|---|---|---|
| 3,424,870 | 1/1969 | Breeden | 179/90 K |
| 3,521,005 | 7/1970 | Dow et al. | 179/90 K |
| 3,612,773 | 10/1971 | Riehm | 179/90 K |
| 3,790,813 | 2/1974 | Ennis | 340/171 PF |
| 4,101,871 | 7/1978 | Oliveira | 179/90 K |

Primary Examiner—Harold I. Pitts
Attorney, Agent, or Firm—Kirschstein, Kirschstein, Ottinger & Cobrin

[57] ABSTRACT

An input circuit for use in the selection of one of n × m inputs signified by the closure of one of n × x m switch units. Each switch unit is a single pole switch connected between one of a first set of n terminals to which a first potential is applied and one of a second set of m terminals to which a second, different potential is applied. A circuit is provided for detecting the flow of current upon closure of a switch and for applying a potential to one of a third set of n terminals and one of a fourth set of m terminals dependent on the switch closed. Said circuit may comprise CMOS devices, allowing the input circuit to exhibit substantially zero quiescent power consumption.

6 Claims, 4 Drawing Figures

INPUT CIRCUITS

BACKGROUND OF THE INVENTION

1. Field of the Invention

This invention relates to input circuits for use in the selection of one of a number of inputs and in particular to such circuits in which substantially zero power is consumed when no input is selected.

Such circuits find many applications, for example, in ultrasonic transmitters for the remote control of television receivers and also in push-button telephone sets.

2. Description of Prior Art

Input circuits of the above kind are known in which one of n×m inputs may be selected, the circuit comprising a set of n terminals and a set of m terminals and the selection of an input being signified by the appearance of a predetermined potential, different from potentials at the other terminals, at a terminal of the first set and at a terminal of the second set. In such circuits n×m switch units are conventionally provided, each unit effectively comprising a double pole switch with its movable contacts both connected to the predetermined potential, one of its fixed contacts connected with a terminal of the first set, and its other fixed contact connected with a terminal of the second set such that no two switches are connected with same two terminals. Selection of a particular input may thus be achieved by operating one of the n×m switch units, thus applying the predetermined potential to a particular terminal of the first set and to a particular terminal of the second set.

SUMMARY OF THE INVENTION

1. Purpose of the Invention

Such known circuits suffer from the disadvantages that such switch units are expensive. Furthermore, if the circuit is an integrated circuit arrangement, then each of the n×m terminals must be provided with an associated "pullup" resistor to maintain each of the terminals at the same potential when not selected, and the provision of such pullup resistors increases assembly time and cost.

It is an object of the invention to provide an input circuit for use in the selection of one of a number of inputs and which may have substantially zero power consumption when no input is selected wherein the above mentioned disadvantages may be overcome.

2. Brief Description of the Invention

The present invention provides an input circuit for use in the selection of one of n×m inputs, the input circuit comprising: a source of a first predetermined potential, a first set of n terminals to which said first predetermined potential is applied, a source of a second predetermined potential different from said first predetermined potential, a set of m terminals to which said second predetermined potential is applied, n×m single pole switches each connected between a terminal of the first set and a terminal of the second set such that no two switches are connected with the same two terminals, and means responsive to the flow of current between any one terminal of the first set and any one terminal of the second set when one of said switches is closed for selecting a particular one of said n×m inputs corresponding to that switch.

It will be appreciated that the expression single pole switch means any switch effectively having two switchedly mutually connectable contacts and is not limited to mechanical switches.

Preferably said means for selecting one of said n×m inputs includes n first signal means each associated with a respective terminal of the first set and each arranged to produce a predetermined signal in response to the flow of current between its associated terminal and any terminal of the second set and m second signal means each associated with a respective terminal of the second set and each arranged to produce a predetermined signal in response to the flow of current between its associated terminal and any terminal of the first set.

Preferably each said signal means is arranged to produce its predetermined signal upon a change in the potential at its associated terminal.

Preferably each said signal means is arranged to be supplied with said first predetermined potential and said second predetermined potential, each said first signal means having impedance means for applying said first predetermined potential through an impedance to its associated terminal and switching means responsive to the potential at its associated terminal for applying said first predetermined potential to an output of the signal means when all the switches connected with its associated terminal are open and for applying said second predetermined potential to said output when a switch connected with its associated terminal is closed, and each said second signal means having impedance means for applying said second predetermined potential through an impedance to its associated terminal and switching means responsive to the potential at its associated terminal for applying said first predetermined potential to an output of the signal means when all the switches connected with its associated terminal are open and for applying said second predetermined potential to said output when a switch connected with its associated terminal is closed.

Preferably each impedance means includes means for returning its associated terminal to said first or second predetermined potential respectively upon the opening of all the switches connected with its associated terminal.

Preferably said impedance means and said switching means comprise metal-oxide-semiconductor devices.

BRIEF DESCRIPTION OF THE DRAWING

One arrangement in accordance with the invention will now be described, by way of example, with reference to the accompanying drawings in which.

PREFERRED EMBODIMENT OF THE INVENTION

Figure 1:
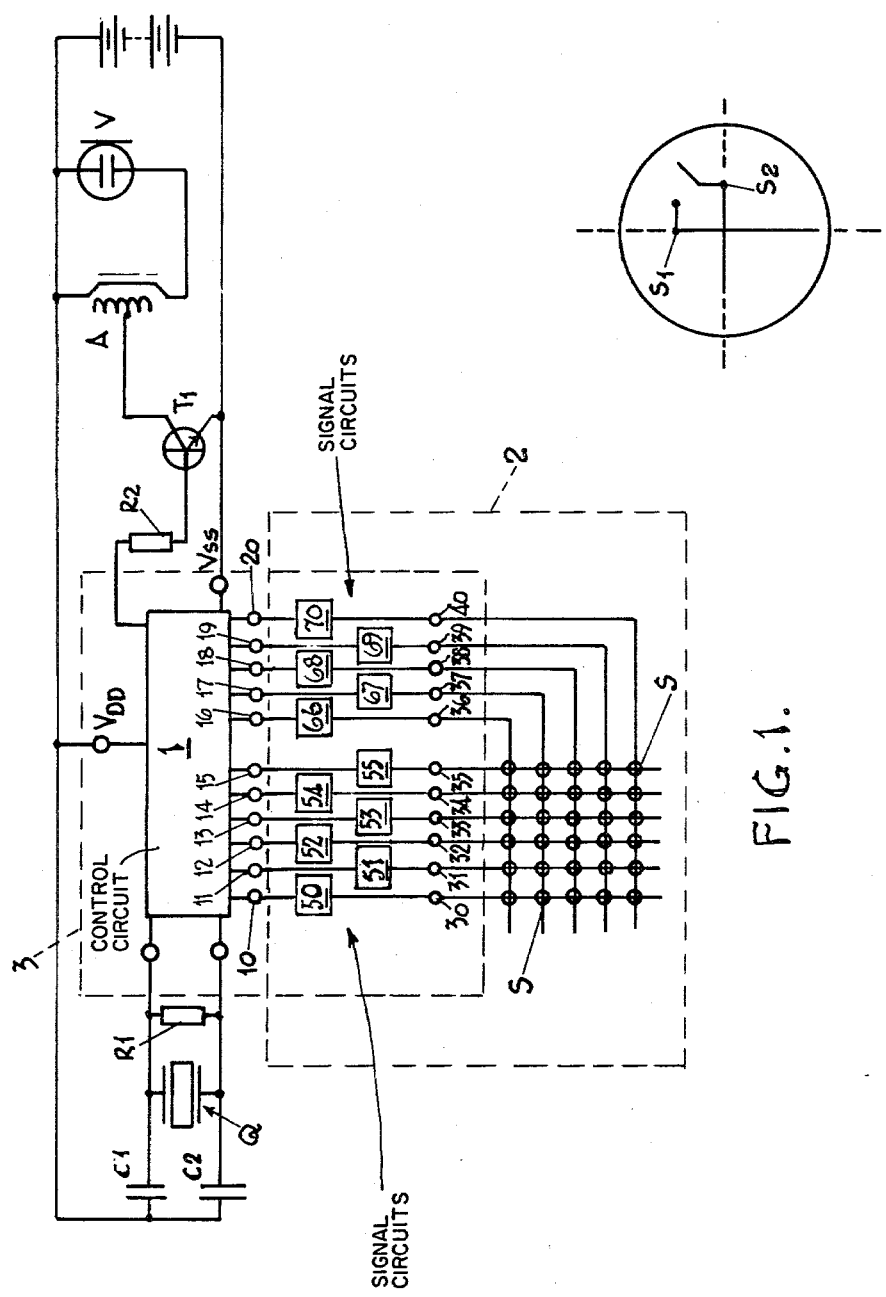
FIG. 1 shows a schematic arrangement of an ultrasonic transmitter including an input circuit in accordance with the invention.

Referring to FIG. 1, the ultrasonic transmitter includes a conventional fixed frequency crystal resonator arrangement Q, $C_1$, $C_2$, $R_1$ fed with a 9 volt d.c. supply. The output of the resonator is fed to a control circuit 1 which produces a selected one of thirty sub-multiple ultrasonic frequencies. The output from the control circuit 1 is amplified by the resistor-transistor arrangement $R_2$, $T_1$ and applied to a transducer arrangement A, V which transmits a corresponding acoustic wave output.

The frequency of the crystal resonator is sub-divided in conventional manner by the control circuit, the particular sub-multiple produced being dependent on which of thirty inputs of an input circuit 2 is selected. The input circuit 2 is connected with 11 terminals 10-20 of the control circuit 1 and the selection of a particular input is signified by the appearance at one of the terminals 10-15 and one of the terminals 16 to 20 of a predetermined potential $V_{ss}$ different from the potential $V_{DD}$ applied to the other terminals.

Figure 2:
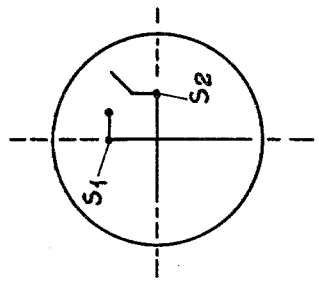
FIG. 2 shows an enlarged schematic view of a switch of the input circuit of the transmitter.

A particular input is selected by closing one of thirty switches S. These switches are each of the single pole type as indicated in FIG. 2. The switches S are each arranged with one switch contact $S_1$ connected with one of six terminals 30-35 and the other switch contact $S_2$ connected with one of five terminals 36-40 such that no two switches S are connected with the same two terminals 30-40. To each of the terminals 30-35 is applied a first predetermined potential $V_{DD}$, e.g. 9 volts, and to each of the terminals 36-40 is applied a second predetermined potential $V_{ss}$, less than $V_{DD}$, e.g. zero volts. When any one of the switches S is closed, an electric current flows from a particular one of the terminals 30-35 to a particular one of the terminals 36-40, thus changing the potential at those terminals to a point approximately midway between $V_{DD}$ and $V_{ss}$.

A separate signal circuit 50-55 is connected between each of the terminals 10-15 and a respective one of the terminals 30-35 and a separate signal circuit 66-70 is connected between each of the terminals 16-20 and a respective one of the terminals 36-40. The signal circuits 50-55 and 66-70 detect, as will be further explained below, these changes in potential and upon detection apply the potential $V_{ss}$ to a particular one of the terminals 10-15 and to a particular one of the terminals 16-20 thus activating a particular one of thirty possible inputs and so causing the transmitter to transmit at a particular sub-multiple of the crystal resonator frequency corresponding to the particular switch S which is closed. When a switch is reopened the signal circuits 50-55 and 66-70 restore the one of the terminals 30-35 and the one of the terminals 36-40 with which the switch is connected to the potentials $V_{DD}$ and $V_{ss}$ respectively.

The control circuit 1 is conventionally arranged so as to respond only to valid inputs, i.e. the application of the potential $V_{ss}$ to only one of the terminals 10-15 and to only one of the terminals 16-20. Also, the transmitter is conventionally so arranged as to supply power to the crystal resonator only upon the selection of a valid input.

Figure 3:
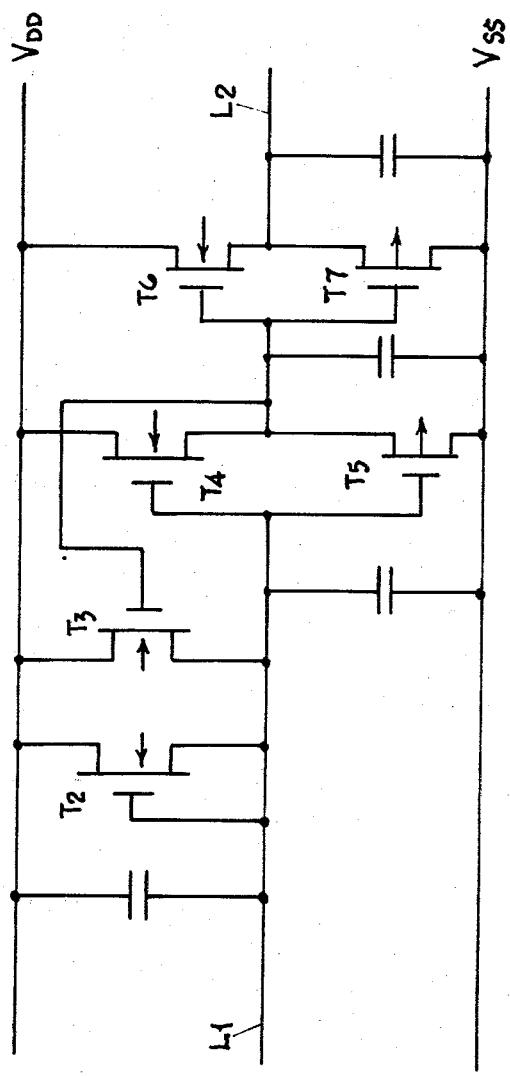
FIGS. 3 and 4 show circuit arrangements forming part of the input circuit of the transmitter.
Figure 4:
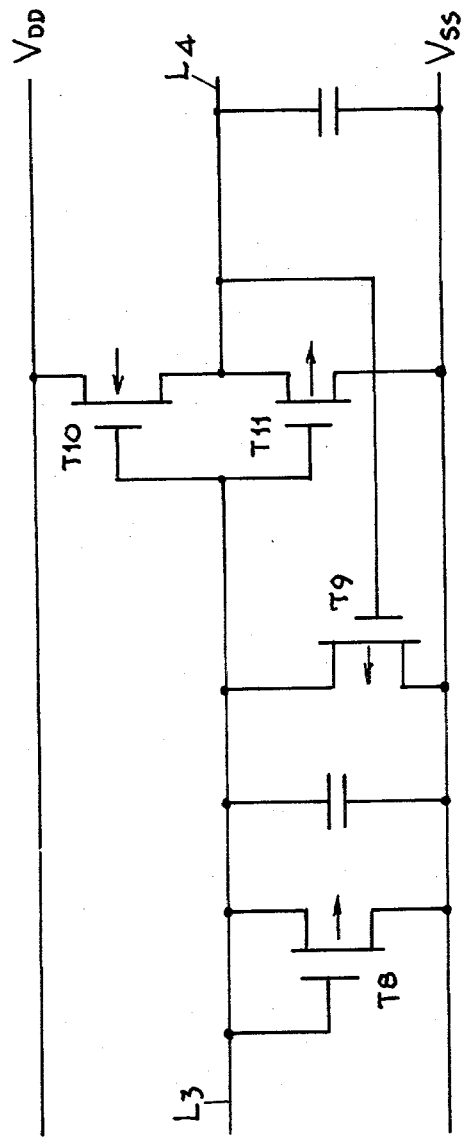

FIGS. 3 and 4 show in detail the circuits used as signal circuits 50-55 and 66-70 respectively in the transmitter of FIG. 1. The circuits of FIGS. 3 and 4 both comprise CMOS devices.

The signal circuits 50-55 are identical and each comprise a circuit as shown in FIG. 3. The signal circuits 66-70 are identical and each comprise a circuit as shown in FIG. 4.

Referring to FIG. 3, each signal circuit 50-55 comprises an arrangement of field-effect transistors $T_2$-$T_7$. The line $L_1$ of each signal circuit 50-55 is connected to one of the terminals 30-35 of the input circuit 2 and the line $L_2$ is connected to one of the terminals 10-15 of the control circuit 1. To each signal circuit 50-55 are applied two different potentials $V_{DD}$ and $V_{ss}$ (e.g. +9 and zero volts respectively).

In the normal state of each signal circuit 50-55 (i.e. with all the switches S with which its line $L_1$ is connected open) transistor $T_2$ is off, transistor $T_4$ is off transistor $T_5$ is on; transistor $T_3$ is on, transistor $T_7$ is off and transistor $T_6$ is on. Thus the potential $V_{DD}$ is applied to line $L_1$ through transistor $T_3$ and to line $L_2$ through transistor $T_6$.

Referring to FIG. 4, each signal circuit 66-70 comprises an arrangement of field-effect transistors $T_8$-$T_{11}$. The line $L_3$ of each signal circuit 66-70 is connected to one of the terminals 36-40 of the input circuit 2 and the line $L_4$ is connected to one of the terminals 36-40 of the control circuit 1. To each signal circuit 66-70 are applied the two different potentials $V_{DD}$ and $V_{ss}$.

In the normal state of each signal circuit 66-70 (i.e. with all the switches with which its line $L_3$ is connected open) transistor $T_8$ is off, transistor $T_{11}$ is off and transistor $T_{10}$ is on; transistor $T_9$ is on. Thus the potential $V_{ss}$ is applied to line $L_3$ through transistor $T_9$ and the potential $V_{DD}$ is applied to line $L_4$ through transistor $T_{10}$.

In the normal state of the input circuit 2, therefore (i.e. with all the switches S open) the potential $V_{DD}$ is applied through an impedance to each of the terminals 30-35, the potential $V_{ss}$ is applied through an impedance to each of the terminals 36-40 and the potential $V_{DD}$ is applied to each of the terminals 10-20 of the control circuit 1.

When a switch S is closed, the line $L_1$ (at the potential $V_{DD}$) of the one of the signal circuits 50-55 with which the switch is connected is connected through the switch with the line $L_3$ (at the potential $V_{ss}$) of the one of the signal circuits 66-70 with which the switch is connected. A current therefore flows between the two signal circuits, changing the potential at both the line $L_1$ of the one of the signal circuits 50-55 and the line $L_3$ of the one of the signal circuits 66-70 to a potential approximately midway between $V_{DD}$ and $V_{ss}$ (e.g. approximately 4.5 volts).

When this occurs, in the one of the signal circuits 50-55 with which the closed switch is connected, in response to the decrease in the potential on the line $L_1$ transistor $T_2$ is turned on, transistor $T_4$ is turned on and transistor $T_5$ is turned off; transistor $T_3$ is turned off, transistor $T_6$ is turned off and transistor $T_7$ is turned on. Thus the potential $V_{ss}$ is applied to the line $L_2$ through transistor $T_7$.

Also when this occurs, in the one of the signal circuits 66-70 with which the closed switch is connected, in response to the increase in the potential on the line $L_3$ transistor $T_8$ is turned on, transistor $T_{10}$ is turned off and transistor $T_{11}$ is turned on; transistor $T_9$ is turned off. Thus the potential $V_{ss}$ is applied to the line $L_4$ through transistor $T_{11}$.

When a switch S is closed, therefore, the potential $V_{ss}$ is applied to one of the terminals 10-15 and to one of the terminals 16-20, the potential $V_{DD}$ being applied to each of the other terminals 10-20 of the control circuit 1. Thus a particular one, corresponding to the particular switch S closed, of thirty possible inputs to the control circuit 1 is activated.

When a switch S is re-opened after being closed, the transistors in the one of the signal circuits 50-55 and the one of the signal circuits 66-70 with which the switch is connected return to their normal states. In this condition however, transistor $T_2$ and transistor $T_8$ are off and cannot re-charge the lines $L_1$ and $L_3$ back to the potential $V_{DD}$ and the potential $V_{ss}$ respectively. For this purpose the transistors $T_3$ and $T_9$ are respectively provided.

Transistors $T_2$ and $T_8$ cooperate, upon closure of an appropriate switch S, to form a CMOS inverter with unity feedback so as to ensure that the potential applied to inverters $T_4$, $T_5$ and $T_{10}$, $T_{11}$ is at a point approximately midway between the potentials $V_{DD}$ and $V_{ss}$. In this way the signal circuits' immunity to spurious signals is maintained over a wide range of transistor parameters.

The ratio of the inverter $T_4$, $T_5$ in the signal circuit of FIG. 3 is so arranged that the switching threshold potential lies between the midway point and the potential $V_{DD}$. Conversely the ratio of the inverter $T_{10}$, $T_{11}$ in the signal circuit of FIG. 4 is so arranged that the switching threshold potential lies between the midway point and the potential $V_{ss}$.

It will be appreciated that the use of CMOS devices enables the circuits of FIGS. 3 and 4 to exhibit substantially zero quiescent power consumption.

It will also be appreciated that the control circuit 1 together with the signal circuits 50–55 and 66–70 may be fabricated in a single integrated circuit signified by the dotted line 3 in FIG. 1.

It will also be appreciated that the switches S, although hereinbefore described as mechanical switches, may alternatively be provided by other forms of switching means, e.g. electronic switching means.

I claim:

1. An input circuit for use in the selection of one of $n \times m$ inputs, the input circuit comprising:
    a source of a first predetermined potential;
    a first set of n terminals to which said first predetermined potential is applied;
    a source of a second predetermined potential different from said first predetermined potential;
    a set of m terminals to which said second predetermined potential is applied;
    $n \times m$ single pole switches each connected between a terminal of the first set and a terminal of the second set such that no two switches are connected to the same two terminals;
    a third set of n terminals each associated with a respective one of the n terminals of the first set;
    a fourth set of m terminals each associated with a respective one of the m terminals of the second set; and
    means responsive to the flow of current between any one terminal of the first set and any one terminal of the second set when one of said switches is closed for applying a predetermined potential to the terminal of the third set associated with said any one terminal of the first set and to the terminal of the fourth set associated with said any one terminal of the second set to select a particular one of said $n \times m$ inputs corresponding to that switch.

2. A circuit according to claim 1 wherein said means for selecting one of said $n \times m$ inputs includes:
    n first signal means, each connected between a respective terminal of the first set and its associated terminal of the third set and each arranged to apply a predetermined potential to its associated terminal of the third set in response to the flow of current between its associated terminal of the first set and any terminal of the second set; and
    m second signal means, each connected between a respective terminal of the second set and its associated terminal of the fourth set and each arranged to apply a predetermined potential to its associated terminal of the fourth set in response to the flow of current between its associated terminal of the second set and any terminal of the first set.

3. A circuit according to claim 2 wherein each said signal means is arranged to apply its predetermined potential upon a change in the potential at its associated terminal of the first or second set.

4. A circuit according to claim 3 wherein each said signal means is arranged to be supplied with said first predetermined potential and said second predetermined potential, each said first signal means having impedance means for applying said first predetermined potential through an impedance to its associated terminal and switching means responsive to the potential at its associated terminal for applying said first predetermined potential to an output of the signal means when all the switches connected with its associated terminal are open and for applying said second predetermined potential to said output when a switch connected with its associated terminal is closed, and each said second signal means having impedance means for applying said second predetermined potential through an impedance to its associated terminal and switching means responsive to the potential at its associated terminal for applying said first predetermined potential to an output of the signal means when all the switches connected with its associated terminal are open and for applying said second predetermined potential to said output when a switch connected with its associated terminal is closed.

5. A circuit according to claim 4 wherein each impedance means includes means for returning its associated terminal to said first or second predetermined potential respectively upon the opening of all the switches connected with its associated terminal.

6. A circuit according to claim 4 wherein said impedance means and said switching means comprise metal-oxide-semiconductor devices.

* * * * *